United States Patent
Saito et al.

(10) Patent No.: US 7,144,823 B2
(45) Date of Patent: Dec. 5, 2006

(54) THERMAL TREATMENT APPARATUS

(75) Inventors: Takanori Saito, Tokyo-To (JP);
Toshiyuki Makiya, Tachikawa (JP);
Hisaei Osanai, Tokyo-To (JP);
Tsuyoshi Takizawa, Tokyo-To (JP);
Tomohisa Shimazu, Tokyo-To (JP);
Kazuhide Hasebe, Tokyo-To (JP);
Hiroyuki Yamamoto, Tokyo-To (JP);
Yukimasa Saito, Tokyo-To (JP);
Kenichi Yamaga, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/494,970

(22) PCT Filed: Sep. 27, 2002

(86) PCT No.: PCT/JP02/10079

§ 371 (c)(1),
(2), (4) Date: Sep. 24, 2004

(87) PCT Pub. No.: WO03/041139

PCT Pub. Date: May 15, 2003

(65) Prior Publication Data

US 2005/0028738 A1    Feb. 10, 2005

(30) Foreign Application Priority Data

Nov. 8, 2001  (JP)  ............................. 2001-342636
Mar. 27, 2002 (JP)  ............................. 2002-088182

(51) Int. Cl.
*H01L 21/31* (2006.01)

(52) U.S. Cl. ...................................... 438/758; 438/763

(58) Field of Classification Search ................. 438/758
See application file for complete search history.

(56) References Cited

U.S. PATENT DOCUMENTS

| 5,578,132 | A  | * | 11/1996 | Yamaga et al. | ............. 118/724 |
| 5,843,794 | A  | * | 12/1998 | Singer | ......................... 436/534 |
| 6,009,831 | A  | * | 1/2000  | Hwang | .................... 118/723 E |
| 6,026,764 | A  | * | 2/2000  | Hwang | .................... 118/723 E |
| 6,190,460 | B1 | * | 2/2001  | Hwang | ........................ 118/729 |
| 2004/0089654 | A1 | * | 5/2004 | Kitano et al. | ................ 219/601 |
| 2005/0255396 | A1 | * | 11/2005 | Kitano et al. | ................ 430/99 |

FOREIGN PATENT DOCUMENTS

| JP | 03-064912 | 3/1991 |
| JP | 07-245273 | 9/1995 |
| JP | 08-124866 | 5/1996 |
| JP | 09-082650 | 3/1997 |

OTHER PUBLICATIONS

International Preliminary Examination Report (PCT/IPEA/409) (translated) issued for PCT/JP2002/10079.
Notification of Transmittal of Copies of Translation of the International Preliminary Examination Report (PCT/IB/338) issued for PCT/JP2002/10079.

* cited by examiner

*Primary Examiner*—Thao P. Le
(74) *Attorney, Agent, or Firm*—Smith, Gambrell & Russell, LLP

(57) ABSTRACT

The present invention is a thermal processing unit including: a heating-furnace body whose upper end has an opening; a heating unit provided on an inside wall of the heating-furnace body; a reaction container consisting of a single tube contained in the heating-furnace body; a gas-discharging-pipe connecting portion formed at an upper portion of the reaction container; and a first temperature controlling unit provided around the gas-discharging-pipe connecting portion.

19 Claims, 4 Drawing Sheets

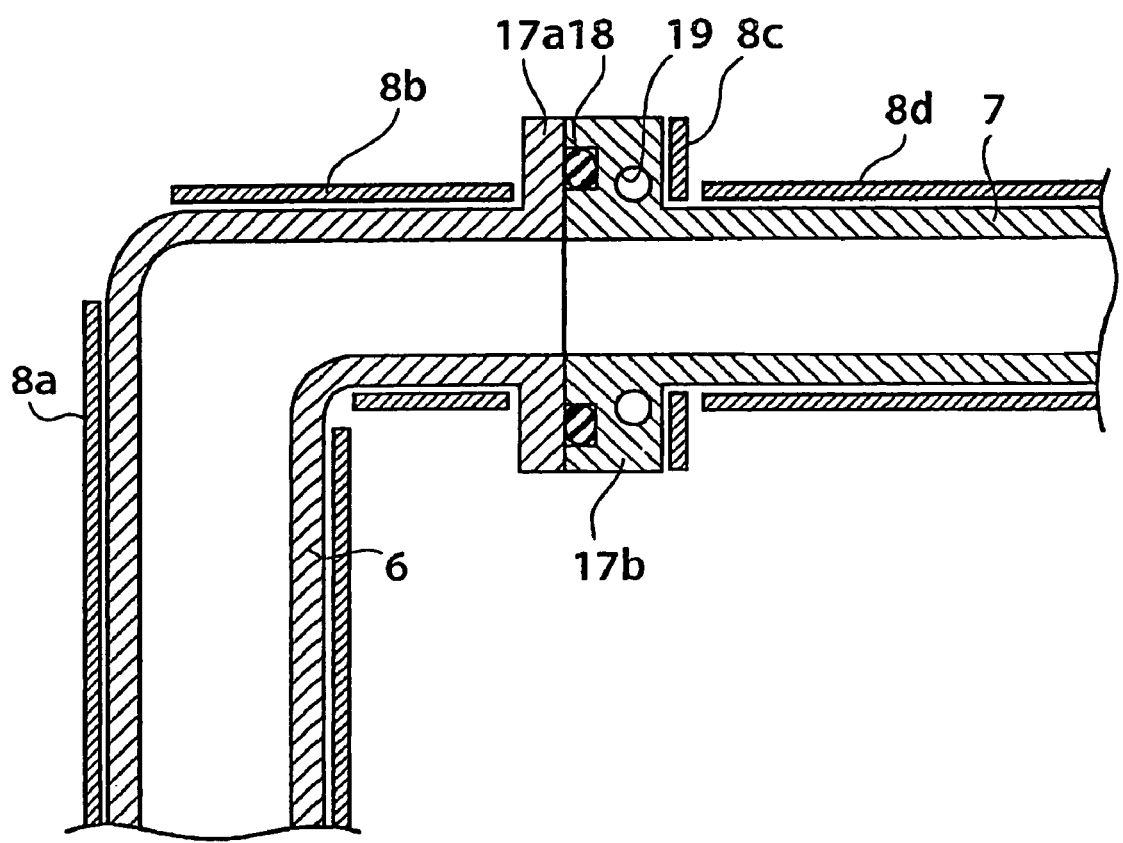
F I G. 2

THERMAL TREATMENT APPARATUS

This application is based upon and claims the benefits of priority from PCT/JP02/10079, filed Sep. 27, 2002, and from prior Japanese patent application JP2001-342636, filed Nov. 8, 2001.

FIELD OF THE INVENTION

The present invention relates to a thermal processing unit and a thermal processing method which are suitable for a thermal process to an object to be processed such as a semiconductor wafer.

DESCRIPTION OF THE RELATED ART

Conventionally, in a semiconductor manufacturing process, there is a step of depositing a thin film or an oxide film onto a surface of a semiconductor wafer as an object to be processed, or a step of conducting a diffusion of impurities onto the surface. For these steps, a thermal processing unit such as a CVD unit, an oxide-film forming unit or a diffusion unit has been used.

In such a thermal processing unit, a plurality of wafers, which are objects to be processed, are placed on a holding tool called a wafer boat in a vertical arrangement, and then loaded in a reaction container called a process tube that has been heated to a high temperature. Then, a reaction gas is introduced into the reaction container, so that a thermal process to the wafers is conducted.

FIG. 4 shows an example of vertical thermal processing unit that has been conventionally used.

In FIG. 4, a heating-furnace body 101 is placed on a base plate 103. A resistance heater 104 is provided on an inside surface of a heat-insulating layer of the heating-furnace body 101.

A reaction container (process tube) is provided in the heating-furnace body 101. The reaction container is surrounded by the resistance heater 104. The reaction container has a double-tube structure of an outer tube 121, whose upper end is closed, and an inner tube 122 installed concentrically to the outer tube 121. The reaction container is adapted to keep its airtightness, in order to form a processing space for conducting a process to wafers that are objects to be processed. The outer tube 121 and the inner tube 122 are made of, for example, quartz.

Respective lower ends of the outer tube 121 and the inner tube 122 are supported by a tubular manifold 105a made of stainless steel or the like. A reaction-container lower lid 110 is provided for hermetically sealing a lower opening of the manifold 105a, the reaction-container lower lid 110 being freely opened and closed.

A rotational shaft 114 is rotatably inserted at a central portion of the reaction-container lower lid 110 via a magnetic-fluid seal 115 in such a manner that the airtightness of the reaction container is maintained. A lower end of the rotational shaft 114 is connected to a rotating mechanism of an elevating mechanism 116. An upper end of the rotational shaft 114 is fixed to a turntable 113. A wafer boat 111 (object-to-be-processed boat), which is a holding tool of objects to be processed, is mounted on the turntable 113 via a heat-insulating cylinder 112. A plurality of silicon wafers W are placed on the wafer boat 111 in a tier-like manner. The wafer boat 111 is made of, for example, quartz.

One or more gas-introducing pipes 109, 109' are horizontally arranged at a lower portion of the manifold 105a in order to introduce a process gas for a wafer process into the inner tube 122 of the reaction container. The gas-introducing pipes 109, 109' are connected to a gas-supplying source, not shown, via a mass flow controller, not shown.

A gas-discharging pipe 120 connected to a vacuum pump, not shown, is connected to an upper portion of the manifold 105a in such a manner that the process gas is discharged from a gap between the outer tube 121 and the inner tube 122 to set a pressure in the reaction container at a predetermined reduced pressure.

Next, a thermal process for semiconductor wafers using the above thermal processing unit is explained.

The thermal process for semiconductor wafers using the above thermal processing unit primarily consists of a preliminary heating step of the thermal processing unit, a loading step of the wafer boat, a thermal processing step and a cooling step.

The preliminary heating step is a step of preliminarily heating the thermal processing unit before the silicon wafers are loaded, in order to start the processing step immediately after the loading step of the silicon wafers.

In the next loading step, the wafer boat on which the silicon wafers are placed is loaded into the heating furnace.

Then, in the thermal processing step, a reaction gas is introduced into the reaction container so that the silicon wafers undergo a thermal process (a predetermined process is conducted).

After the process to the silicon wafers is completed, the heating and the supply of the reaction gas are stopped, and the reaction gas and any generated gas remaining in the reaction container are discharged by using a nitrogen gas while the reaction container is cooled (cooling step).

Herein, recently, it has been requested to enhance throughput of a semiconductor manufacturing unit, and various improvements have been achieved.

In order to enhance throughput of a semiconductor process without having any effect on film quality of a surface of the semiconductor wafer, the greatest possibility is to shorten times of the preliminary heating step and the cooling step. Then, in order to shorten the times of the steps, it is necessary to shorten the heating time and the cooling time. For that purpose, it is necessary to reduce thermal capacity of each member in the heating furnace in order to achieve rapid heating and rapid cooling.

However, in the conventional thermal processing unit, since the reaction container has the double-tube structure, the thermal capacity thereof is large. Thus, the conventional thermal processing unit is not suitable for rapid heating and rapid cooling. Thus, the conventional thermal processing unit can not satisfy the recent request of enhancing the throughput of a semiconductor manufacturing unit.

SUMMARY OF THE INVENTION

An object of the present invention is to provide a thermal processing unit suitable for rapid heating and rapid cooling in which unevenness in heating an object to be processed such as a silicon wafer is improved.

Another object of the present invention is to achieve a thermal processing unit and a thermal processing method using the thermal processing unit wherein temperature control is easy and wherein particle generation is effectively prevented.

This invention is a thermal processing unit comprising: a heating-furnace body whose upper end has an opening; a heating unit provided on an inside wall of the heating-furnace body; a reaction container consisting of a single tube contained in the heating-furnace body; a gas-dischargingpipe connecting portion formed at an upper portion of the reaction container; and a first temperature controlling unit provided around the gas-discharging-pipe connecting portion.

According to the invention, since the reaction container consists of a single tube and has a smaller thermal capacity, rapid heating and rapid cooling can be achieved. In addition, since a temperature at the gas-discharging-pipe connecting portion is controlled by the first temperature controlling unit, particle generation at the gas-discharging-pipe connecting portion can be effectively prevented.

Preferably, a gas-discharging pipe for discharging atmosphere in the reaction container is connected to the gas-discharging-pipe connecting portion, and a second temperature controlling unit is provided around the gas-discharging pipe. In the case, preferably, the first temperature controlling unit and the second temperature controlling unit are adapted to be controlled independently.

In addition, in the case, preferably, a flange is formed at an end portion of the gas-discharging-pipe connecting portion, another flange is formed at an end portion of the gas-discharging pipe, and the flange at the end portion of the gas-discharging-pipe connecting portion and the flange at the end portion of the gas-discharging pipe are hermetically connected via a sealing member. In the case, preferably, on at least one of the flange at the end portion of the gas-discharging-pipe connecting portion and the flange at the end portion of the gas-discharging pipe, a third temperature controlling unit for controlling a temperature at a connecting portion of the flanges is provided.

For example, the third temperature controlling unit has a liquid-flowing tunnel formed in the flange. Alternatively, the third temperature controlling unit has a heating unit for control provided in a vicinity of the flange.

In addition, in the case, preferably, the first temperature controlling unit, the second temperature controlling unit and the third temperature controlling unit are adapted to be controlled independently.

In addition, preferably, the gas-discharging-pipe connecting portion is bent. In the case, preferably, the gas-discharging-pipe connecting portion is bent at an angle of about 90 degrees.

In addition, preferably, the gas-discharging-pipe connecting portion is formed in such a manner that the gas-discharging-pipe connecting portion is integral with and extended from the reaction container.

In addition, preferably, the gas-discharging-pipe connecting portion has a cervical portion whose diameter gradually reduces from a diameter at an upper portion of the reaction container. In the case, preferably, an assistant heating unit is provided in a vicinity of the cervical portion of the gas-discharging-pipe connecting portion.

Each of the temperature controlling units is, for example, a heat-insulating member. Alternatively, each of the temperature controlling units is, for example, a resistance heater.

For example, each of the temperature controlling units has flexibility. Alternatively, each of the temperature controlling units has been formed into a shape in advance.

In addition, the invention is a thermal processing method of an object to be processed using a thermal processing unit, the thermal processing unit including: a heating-furnace body whose upper end has an opening; a heating unit provided on an inside wall of the heating-furnace body; a reaction container consisting of a single tube contained in the heating-furnace body; a gas-discharging-pipe connecting portion formed at an upper portion of the reaction container; a first temperature controlling unit provided around the gas-discharging-pipe connecting portion; and an object-to-be-processed boat arranged in the reaction container, for holding an object to be processed;

the thermal processing method comprising:
a step of conducting a thermal process of the object to be processed by means of the heating unit, and
a step of controlling a temperature of the gas-discharging-pipe connecting portion to a temperature substantially equal to a thermal processing temperature of the object to be processed, by means of the first temperature controlling unit.

Alternatively, the invention is a thermal processing method of an object to be processed using a thermal processing unit, the thermal processing unit including: a heating-furnace body whose upper end has an opening; a heating unit provided on an inside wall of the heating-furnace body; a reaction container consisting of a single tube contained in the heating-furnace body; a gas-discharging-pipe connecting portion formed at an upper portion of the reaction container; an object-to-be-processed boat arranged in the reaction container, for holding an object to be processed; a gas-discharging pipe connected to the gas-discharging-pipe connecting portion, for discharging atmosphere in the reaction container; and a second temperature controlling unit provided around the gas-discharging pipe;

the thermal processing method comprising:
a step of conducting a thermal process of the object to be processed by means of the heating unit, and
a step of controlling a temperature of the gas-discharging pipe to a temperature of 150 to 300° C., by means of the second temperature controlling unit.

BRIEF DESCRIPTION OF THE DRAWINGS

FIG. 2 is an enlarged view of a main part of FIG. 1;

DESCRIPTION OF THE PREFERRED EMBODIMENT

Hereinafter, embodiments of the present invention will be described with reference to the attached drawings.

(First Embodiment)

Figure 1:
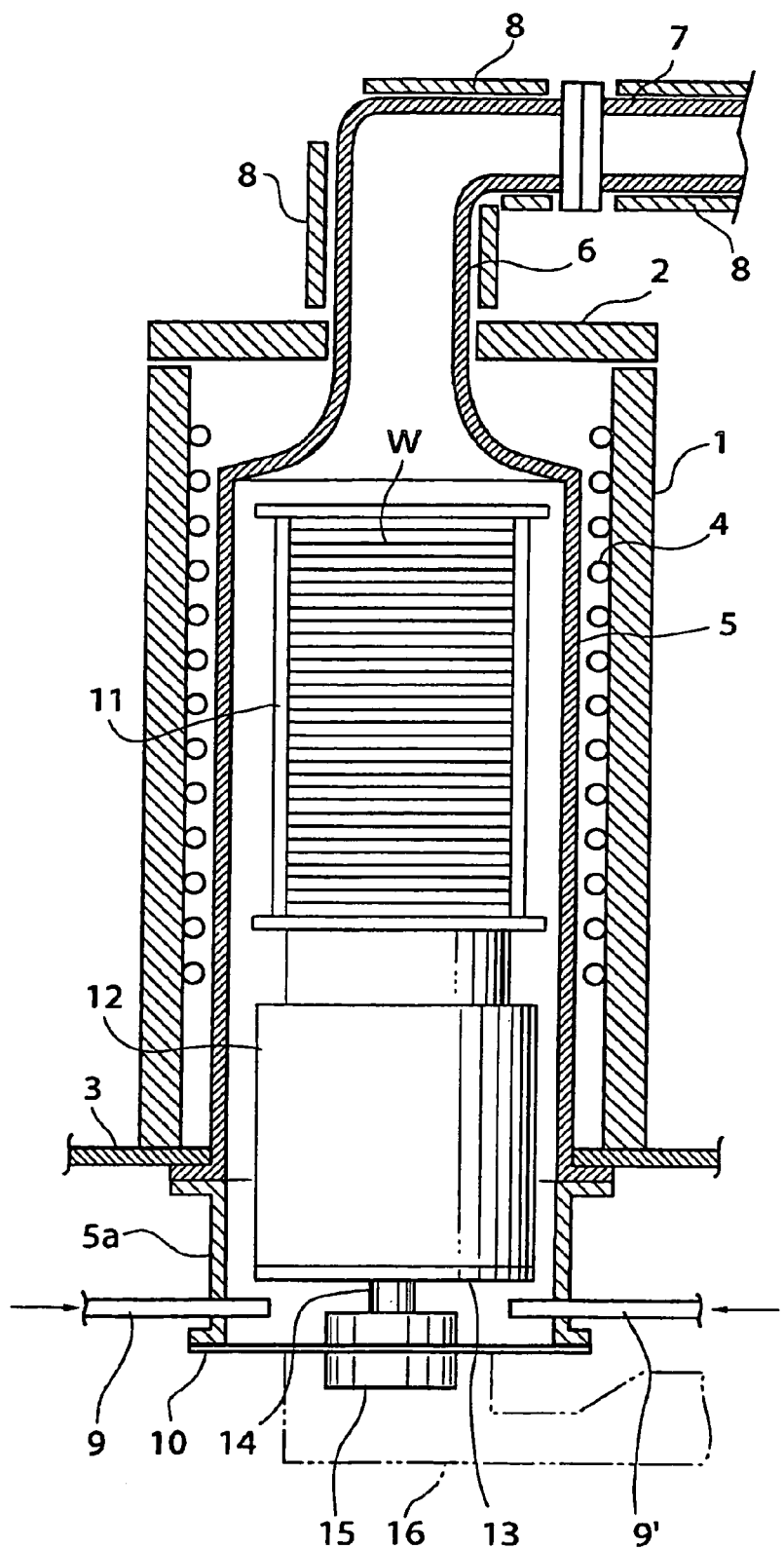
FIG. 1 is a schematic sectional view showing a thermal processing unit according to a first embodiment of the present invention.

FIG. 1 is a schematic sectional view showing a thermal processing unit according to a first embodiment of the present invention. The thermal processing unit of the embodiment comprises: a furnace body 1; a process tube 5 of a single-tube structure as a reaction container arranged in the furnace body 1; a gas-discharging-pipe connecting portion 6 extended from the process tube 5; and a gas-discharging pipe 7 closely connected to an end portion of the gas-discharging-pipe connecting portion 6.

In the thermal processing unit of the embodiment, an upper end of the furnace body 1 has an opening. The opening is covered with a furnace-body lid 2. A central portion of the furnace-body lid 2 is provided with an opening. On the other hand, an upper end of the process tube 5 protrudes to form the gas-discharging-pipe connecting portion 6. Thus, after the process tube 5 is arranged in the furnace body 1, the gas-discharging-pipe connecting portion 6 penetrates the opening of the furnace-body lid 2 so that the furnace body 1 is covered with the furnace-body lid 2. Preferably, the furnace-body lid 2 is formed by combination of a plurality of dividable members.

A resistance heater (heating unit) 4 is installed inside a wall surface of the furnace body 1. The furnace body 1 is placed on a base plate 3. By means of the resistance heater 4, the furnace body 1 is heated to about 300 to 1100° C., whose temperature may be different between thermal processes.

The process tube 5 is a single-tube type of reaction container, made of ceramics such as quartz glass or silicon carbide. A lower end of the process tube 5 has an opening. A manifold 5a made of stainless steal or the like is connected to the opening. At least one reaction-gas introducing pipes 9, 9' are inserted through a lateral wall of the manifold 5a. A reaction gas for a wafer process is adapted to be supplied from the reaction-gas introducing pipes 9, 9'. A reaction-container lower lid 10 is hermetically connected to a lower end of the manifold 5a via an O-ring, not shown.

An object-to-be-processed boat 11 made of quartz, horizontally holding a plurality of wafers W at regular intervals in a vertical direction, is arranged in the process tube 5. The object-to-be-processed boat 11 is arranged on a heat-insulating cylinder 12 in order to prevent heat dissipation from a lower portion of the object-to-be-processed boat 11. The heat-insulating cylinder 12 is placed on a turntable 13 that can cause the object-to-be-processed boat 11 to freely rotate. The turntable 13 is connected to a rotational shaft 14. The rotational shaft 14 penetrates an opening provided at a central portion of the reaction-container lower lid 10 and is rotatably supported by an elevating mechanism 16 while airtightness is maintained by a magnetic-fluid seal 15. The elevating mechanism 16 is adapted to support the object-to-be-processed boat 11 in such a manner that the object-to-be-processed boat 11 is movable in a vertical direction.

The gas-discharging-pipe connecting portion 6, whose diameter is smaller than a maximum diameter of a main body of the process tube 5, is formed in such a manner that the gas-discharging-pipe connecting portion 6 is integral with and extended from the process tube 5. The gas-discharging-pipe connecting portion 6 penetrates the opening of the furnace-body lid 2 to protrude outside the furnace body 1.

The protruding part from the furnace-body lid 2 of the gas-discharging-pipe connecting portion 6 is located outside an area that may be heated by the heating unit. Thus, a temperature at the protruding part tends to fall. Because of that, as shown in FIG. 2, a vertical-part first temperature controlling unit 8a is arranged around a vertical part of the gas-discharging-pipe connecting portion 6, and a horizontal-part first temperature controlling unit 8b is arranged around a horizontal part of the gas-discharging-pipe connecting portion 6. Thus, the periphery of the gas-discharging-pipe connecting portion 6 can be heated or heat-retained in order not to generate a great difference between a temperature around the gas-discharging-pipe connecting portion 6 and a temperature of the main body of the process tube 5 as a reaction container.

The reason that the temperature controlling units are arranged around the gas-discharging-pipe connecting portion 6 is as follows. That is, when an exhaust gas such as a reaction gas and/or a generated gas reaches the gas-discharging-pipe connecting portion 6 during a process in the thermal processing furnace, if a temperature of the gas-discharging-pipe connecting portion 6 is relatively low, the exhaust gas may be deposited at the gas-discharging-pipe connecting portion 6, so that an impurity film may be formed in the gas-discharging-pipe connecting portion 6. If the undesired film grows, it gradually becomes easier for the film to peel off. When the film peels off, the film becomes particles, which may contaminate the silicon wafers on the object-to-be-processed boat 11 arranged in the process tube 5. For avoiding the above problems, the first temperature controlling units 8a, 8b are provided around the gas-discharging-pipe connecting portion 6 in order for the temperature of the gas-discharging-pipe connecting portion 6 not to fall too much with respect to the temperature of the main body of the process tube 5. Thus, generation of the undesired deposit can be prevented.

A heat-insulating material or a resistance heater may be used as the first temperature controlling units 8a, 8b arranged in the vicinity of the gas-discharging-pipe connecting portion 6. In particular, it is preferable that a resistance heater is used as the first temperature controlling units in order to enhance the effect of heat-retaining.

In addition, the temperature of the gas-discharging-pipe connecting portion 6 is preferably equal to a wafer process temperature (processing temperature). Thus, uniformity of temperatures of the wafers arranged in an upper portion of the process tube 5 can be remarkably improved. In addition, in the case, the number of dummy wafers, which are generally arranged on the uppermost stages of the wafer boat 11 for the uniformity of temperatures of the wafers, can be reduced. Thus, the height of the heating unit may be reduced.

The vertical-part first temperature controlling unit 8a and the horizontal-part first temperature controlling unit 8b may be integral with each other.

Preferably, the resistance heater is a heater made of a carbon wire including fewer impurities. In addition, the heater may be a flexible heater that can be wound around the gas-discharging-pipe connecting portion 6 with a complicated shape, or may be a heater that has been formed in advance into a shape to be fitted with the shape of the gas-discharging-pipe connecting portion 6.

As the flexible heater, a carbon wire may be used, the carbon wire including: a wire-like heater-main-body formed by braiding a plurality of carbon fibers; and metal terminals attached to both ends of the heater-main-body. Such a flexible heater may be installed by winding around the gas-discharging-pipe connecting portion 6 of the upper portion of the process tube 5.

Alternatively, as the previously-shaped heater, a seal heater may be used, the seal heater being formed by forming the above carbon wire into a predetermined shape, sandwiching the carbon wire between two quartz glass plates, and heating the two quartz glass plates to melt them and fix them to the carbon wire in a predetermined shape. The seal heater made of quartz glass has only very low possibility of impurities contamination, which is suitable for the present invention.

In any case, in order to avoid impurities contamination, it is preferable to design the unit in such a manner that a temperature controlling unit may be easily arranged in the unit.

As shown in FIG. 1, it is preferable that the gas-discharging-pipe connecting portion 6 is bent at an angle of about 90 degrees toward a lateral direction of the process tube 5. If a temperature of a connecting portion of the gas-discharging-pipe connecting portion 6 and the gas-discharging pipe 7 is lower than that of the main body of the process tube 5, the reaction gas and/or the generated gas remaining in the exhaust gas are cooled to be solidified in that portion, so that impurity films may be formed in that portion. Then, the impurity films may be peel off to generate particles. Thus, if the connecting portion is located just above the object-to-be-processed boat, the particles generated in the connecting portion may fall directly on the object-to-be-processed boat, which may cause contamination of the silicon wafers. Therefore, it is preferable that the gas-discharging-pipe connecting portion 6 is bent, in order for the particles not to fall directly on the object-to-be-processed boat, even if the particles are generated in the connecting portion of the gas-discharging-pipe connecting portion 6 and the gas-discharging pipe 7.

In addition, as the gas-discharging-pipe connecting portion 6 is bent, radiation heat from the resistance heater 4 that heats the process tube 5 doesn't directly reach a flange 17a formed at an end portion of the gas-discharging-pipe connecting portion 6, a flange 17b formed at an end portion of the gas-discharging pipe 7, and the gas-discharging pipe 7. Thus, temperature controls for their members are easy. In that view, preferably, the end portion of the gas-discharging-pipe connecting portion 6 is extended nearly to an extension line of the lateral surface of the main body of the process tube 5.

As shown in FIG. 2, the flange 17a formed at the end portion of the gas-discharging-pipe connecting portion 6 is closely and hermetically fixed to the flange 17b formed at the gas-discharging pipe 7, via an O-ring 18 made of an elastomer such as a fluorine resin.

A heat-resistant temperature of the O-ring 18 (elastomer) is usually about 300° C. Thus, if the O-ring 18 is heated to a high temperature, the quality of the O-ring 18 may be deteriorated, that is, the sealing performance may be deteriorated. In order to prevent the deterioration of the sealing performance, it is necessary to control a temperature of a portion close to the O-ring 18. In the embodiment, a fluid way 19 for temperature control is formed at the flange 17b, and a fluid for temperature control, such as cooling water, flows through the fluid way 19. Thus, the temperature of the flange 17b is adapted to be controlled suitably. In addition, as shown in FIG. 2, if a resistance heater (third temperature controlling unit) 8c is arranged along a side wall of the flange 17b of the gas-discharging pipe 7, the temperature distribution can be controlled more accurately.

The gas-discharging pipe 7 connected to the end portion of the gas-discharging-pipe connecting portion 6 is connected to a suction unit such as a vacuum pump, not shown. Thus, a vacuum can be created in the process tube 5, and the remaining reaction gas, the generated gas and the like can be discharged from the process tube.

In the embodiment, a second temperature controlling unit 8d is arranged around the gas-discharging pipe 7. Thus, more accurate temperature control can be achieved. An electric heater is preferably used as the second temperature controlling unit 8d, because the control of the electric heater is easy. It is preferable that the temperature of the gas-discharging pipe 7 is controlled within a range of 150 to 300° C. More preferable temperature of the gas-discharging pipe 7 is 200° C. By means of the above temperature control, even if the exhaust (discharged) gas from the process tube 5 passes through the gas-discharging pipe 7, it can be prevented that any impurity film is generated as an unnecessary deposit in the gas-discharging pipe 7.

The exhaust gas discharged from the gas-discharging pipe 7 is cooled by a trap, not shown, which is connected to the gas-discharging pipe 7 and has cooling fins or the like. Thus, the exhaust gas (remaining reaction gas, generated gas or the like) discharged from the process tube 5 may be solidified and trapped thereby. It is preferable that the trap is arranged between a flange (not shown) at the other end of the gas-discharging pipe 7 and a vacuum pump (not shown) connected to the gas-discharging pipe 7.

As described above, according to the thermal processing unit of the embodiment, the temperatures of the respective members are positively controlled by means of: the first temperature controlling units 8a, 8b for controlling the temperature of the gas-discharging-pipe connecting portion 6; the fluid-flowing tunnel for temperature control (third temperature controlling unit) 19 buried in the flange 17b of the gas-discharging pipe 7; the resistance heater (third temperature controlling unit) 8c arranged for the side-wall portion of the flange 17b of the gas-discharging pipe 7; and the second temperature controlling unit 8d arranged along the gas-discharging pipe 7. Thus, in the vicinities of these members, it can be effectively prevented that an impurity film as an unnecessary deposit is generated and that particles are generated from the impurity film.

In addition, in order to improve the accuracy of temperature control, it is preferable to arrange a temperature detecting unit such as a temperature sensor at a necessary portion of each member, to conduct a temperature control by using a detected temperature. In a simple way, the temperature control may be conducted in accordance with a temperature-control sequence that has been set in advance.

(Second Embodiment)

Next, a second embodiment according to the invention is explained. In the second embodiment, arrangements of the heating unit for the reaction container and the temperature controlling units are optimized, uniformity of thermal processing temperature within the surface of a substrate such as a wafer is improved, and generation of defect of the substrate caused by ununiform heating is prevented.

Figure 3:
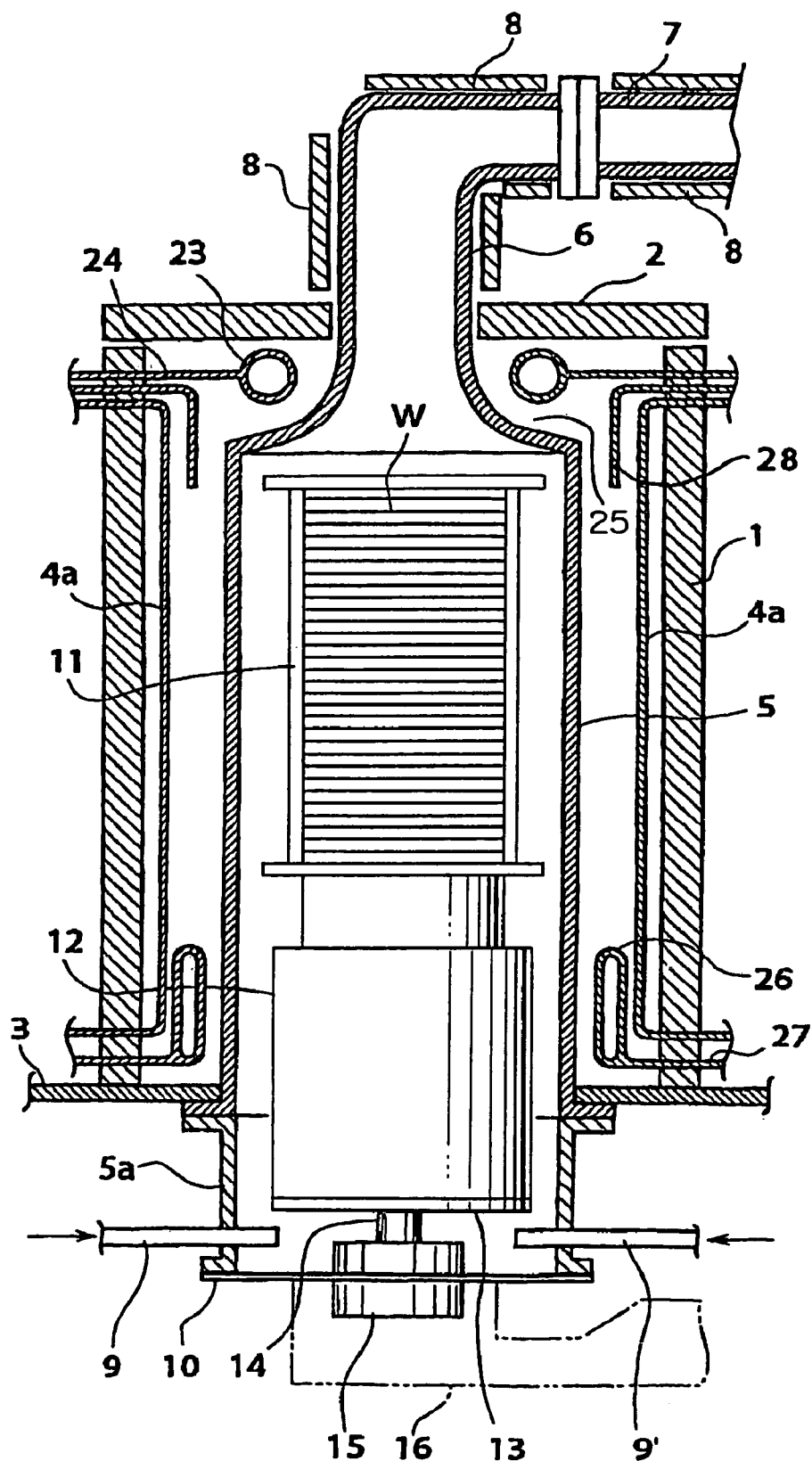
FIG. 3 is a schematic sectional view showing a thermal processing unit according to a second embodiment of the present invention.

The thermal processing unit of the second embodiment is shown in FIG. 3. In FIG. 3, the same elements as in FIG. 1 are accompanied with the same numeral references, and the explanation thereof is omitted.

With reference to FIG. 3, the gas-discharging-pipe connecting portion 6 is formed upward from an upper portion of the process tube 5 by reducing the diameter of the process tube 5. A spiral heater 23 is arranged at a cervical portion of the gas-discharging-pipe connecting portion 6, that is, a portion represented by a numeral reference 25 in FIG. 3. Terminals 24 of the spiral heater 23 hermetically protrude outside the furnace body 1. Thus, the spiral heater 23 may be heated by electric power supplied from a controller, not shown.

A plurality of spiral heaters 23 are uniformly arranged around the cervical portion 25 of the gas-discharging-pipe connecting portion 6, so that the plurality of spiral heaters 23 are adapted to heat portions close to the center of an object to be processed W located on the uppermost stage of the wafer boat 11 uniformly (symmetrically with respect to the center of the object to be processed W). The upper surface of the substrate W located on the uppermost stage of the wafer boat 11 is opposite to the gas-discharging-pipe connecting portion 6, that is, opposite to a way for discharging the atmospheric gas in the process tube 5. In addition, the uppermost stage of the wafer boat 11 is the furthest from linear heaters 4a extending in a vertical direction as a heating unit for the reaction container, so that the temperature of the uppermost stage tends to fall the most. However, as the spiral heaters 23 are arranged to heat the portions close to the center of the object to be processed W located on the uppermost stage of the wafer boat 11, ununiformity of temperature within the surface of the object to be processed can be solved.

For example, each spiral heater 23 consists of: a tubular member made of a material having electrical-insulating properties and heat-resisting properties, such as quartz, and formed into a tubular shape; and a carbon wire heater arranged in the tubular member. The material for those is not limited to quartz, but may be another material having equivalent functions.

It is preferable that four spiral heaters 23 are arranged around the cervical portion 25 of the gas-discharging-pipe connecting portion 6. In addition, at least one of the spiral heaters 23 is preferably movable. In the case, assembling and disassembling operations of the thermal processing unit have no drawback.

In addition, in FIG. 3, the linear wire 4a is a heating unit for heating the object to be processed W from an outside of the process tube 5, and is a linear heater wherein the carbon wire is protected (surrounded) by the quartz tube. In the first embodiment shown in FIG. 1, the heater is arranged in a spiral or circular manner so as to surround the process tube 5. However, in the second embodiment, the linear heater 4a is arranged to extend in an axial direction of the process tube 5. The above heater 4a has a small thermal capacity, and thus is superior in dynamic temperature characteristics. That is, the heater 4a can be rapidly heated and rapidly cooled. In addition, the heater 4a can be easily controlled. In the embodiment, a plurality of linear heaters 4a are arranged so as to surround the process tube 5.

In addition, as shown in FIG. 3, one or more upper-portion heaters 28 may be arranged in an upper portion of the process tube 5. In addition, one or more lower-portion spiral heaters 26 may be arranged in a lower portion of the process tube 5 in order to heat the objects to be processed W located in a lower portion of the wafer boat 11.

If the upper-portion heaters 28 are arranged, heating uniformity at the upper portion of the process tube may be improved.

If the lower-portion heaters 26 are arranged, heat dissipation from the objects to be processed W arranged in the lower portion of the wafer boat 11 through the lower end of the process tube 5 may be prevented.

Preferably, each of the upper-portion heaters 28 and the lower-portion heaters 26 consists of a carbon wire heater contained in a quartz tube, similarly to the above spiral heater 23. Each of the upper-portion heaters 28 and the lower-portion heaters 26 may have a circular shape, a elliptical shape or a compressed circular shape. The respective shapes of the upper-portion heaters 28 and the lower-portion heaters 26 and the respective numbers of the upper-portion heaters 28 and the lower-portion heaters 26 may be suitably designed based on a thermal calculation in the reaction container.

According to the embodiment, the temperature control is easy, and the particle generation can be effectively prevented. In addition, since the linear wire 4a has a small thermal capacity, the embodiment is suitable for rapid heating and rapid cooling, and the embodiment can remarkably improve the ununiformity in heating the objects to be processed such as silicon wafers.

(Heating Method)

Hereinafter, a method of conducting a thermal process to silicon wafers as objects to be processed by using the above embodiments is explained.

At first, the whole heating furnace is preliminary heated to a reaction temperature or vicinity thereof. Then, a plurality of silicon wafers W to be thermally processed are placed on the object-to-be-processed boat 11. The boat 11 is set in the system consisting of the heat-insulating cylinder 12, the rotational shaft 14, the rotational bearing 15 and the object-to-be-processed-boat elevating mechanism 16 while the system is unloaded outside the furnace body 1.

Then, the process tube 5 is set over the object-to-be-processed boat 11, and the reaction-container lower lid 10 and the process tube 5 are hermetically sealed to each other via the O-ring (not shown). At this stage, the gas-discharging pipe 7 has not been connected to the gas-discharging-pipe connecting portion 6 of the process tube 5 yet.

Then, while the upper opening of the furnace body 1 is open, the wafer boat 11 covered by the process tube 5 is loaded into a predetermined position of the furnace body 1 through the lower portion of the furnace body 1. Then, the furnace-body lid 2 is set so as to surround the gas-discharging-pipe connecting portion 6 of the process tube 5, which protrudes upward from the upper portion of the furnace body 1. Preferably, the furnace-body lid 2 is made of a heat-insulating material, in order for the heat of the process tube 5 not to dissipate through the upper portion thereof.

Then, the flange 17a at the end portion of the gas-discharging-pipe connecting portion 6 and the flange 17b at the end portion of the gas-discharging pipe 7 are connected with each other, and the respective temperature controlling units 8a, 8b, 8c, 8d are arranged for the gas-discharging-pipe connecting portion 6 and the gas-discharging pipe 7. Then, a supplier of a fluid for temperature control is connected to the liquid-flowing tunnel 19 of the flange 17b. Then, assembly of the unit is completed.

Then, when the heating units 4, 4a heats the furnace body 1, the temperatures of the gas-discharging system from the process tube are controlled within suitable ranges by means of the temperature controlling units 8a, 8b, 8c, 8d, while the vacuum pump not shown creates a vacuum in the furnace.

Then, a reaction gas is supplied form a reaction-gas introducing port to start a reaction (thermal process).

After the reaction is continued for a predetermined time, the supply of the reaction gas is stopped. Then, a nitrogen gas is supplied, and the gas remaining in the process tube (the reaction gas and any generated gas) is discharged. The vacuum pump continues to create a vacuum, but the heating operation is stopped and the heating furnace is cooled.

According to the above steps, a process to the silicon wafers is completed.

In the above embodiments of the invention, the silicon wafer is explained as an object to be processed. However, the object to be processed is not limited to the silicon wafer, but may be a LCD substrate or a glass substrate.

EXAMPLE

Hereinafter, a specific example of the invention is explained.

A process tube as shown in FIG. 1 was made of quartz glass.

100 silicon wafers were mounted on a wafer boat made of quartz glass in an alignment, and a silicon nitride film having a thickness of 70 nm was deposited on a surface of each silicon wafer at a reaction temperature of 700° C. by using the process tube and by using a silane-base gas as a reaction gas and an ammonium gas. The gas-discharging-pipe connecting portion 6 was heated to 700° C. by means of a carbon wire heater.

Figure 4:
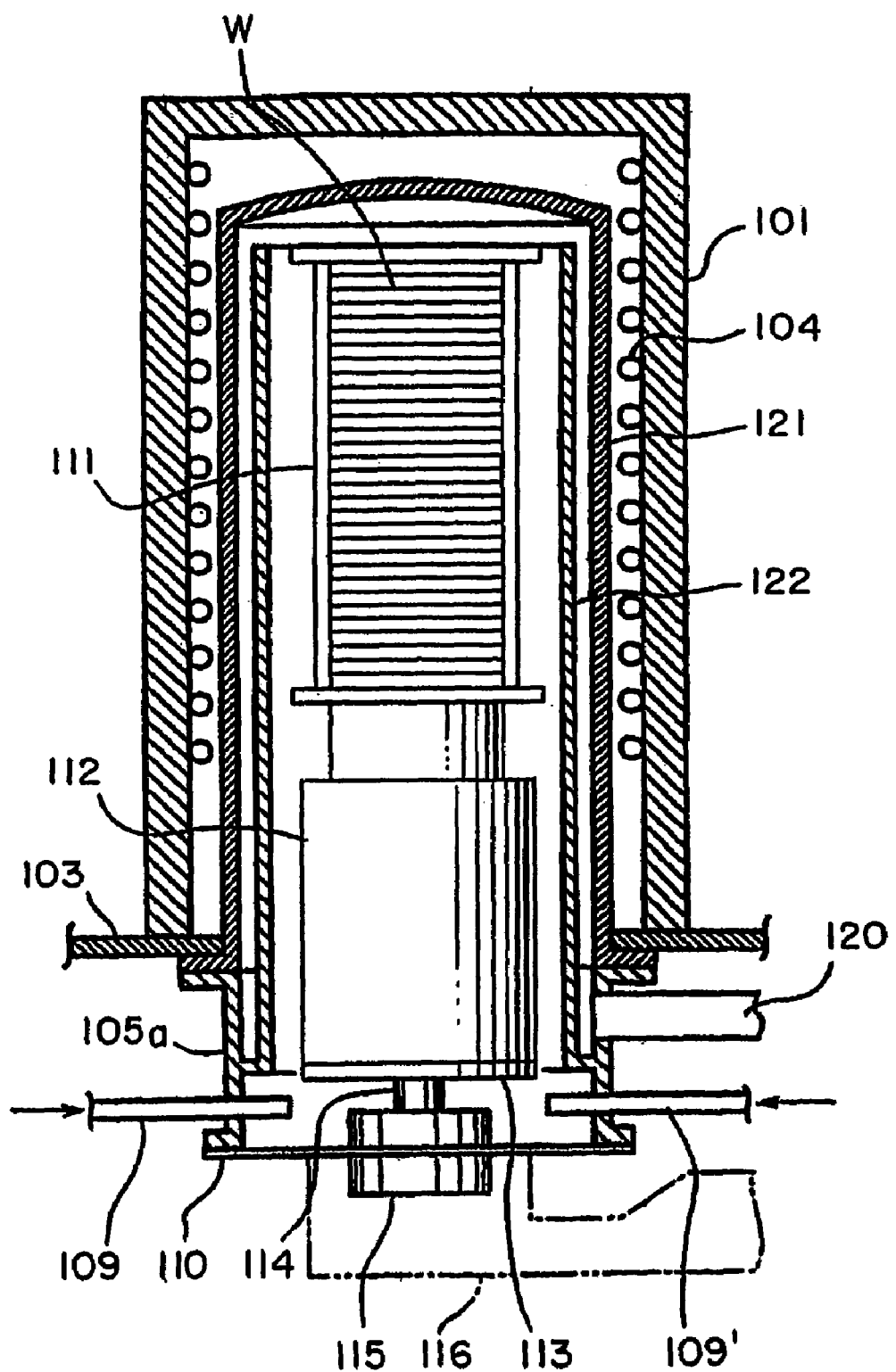
FIG. 4 is a schematic sectional view showing a conventional thermal processing unit.

As a comparison, a silicon nitride film was formed under the same conditions, by using a double-tube type of process tube as shown in FIG. 4.

As a result, in the example of the invention, it took 200 minutes to complete the steps of from preliminary heating to taking-out the silicon wafers. On the other hand, according to the comparison, it took 230 minutes.

In addition, in both cases, particle contamination of silicon wafers was not generated. Furthermore, in silicon wafers mounted in an upper portion of the wafer boat, there was no phenomenon of ununiformity in heating.

The invention claimed is:

1. A thermal processing unit comprising:
   a heating-furnace body whose upper end has an opening,
   a furnace-body lid provided at an opening of the heating-furnace body,
   a heating unit provided on an inside wall of the heating-furnace body,
   a reaction container consisting of a single tube contained in the heating-furnace body,
   a gas-discharging-pipe connecting portion formed at an upper portion of the reaction container and penetrating the furnace-body lid, and
   a first temperature controlling unit provided around the gas-discharging-pipe connecting portion.

2. A thermal processing unit according to claim 1, wherein
   a gas-discharging pipe for discharging atmosphere in the reaction container is connected to the gas-discharging-pipe connecting portion, and
   a second temperature controlling unit is provided around the gas-discharging pipe.

3. A thermal processing unit according to claim 2, wherein the first temperature controlling unit and the second temperature controlling unit are adapted to be controlled independently.

4. A thermal processing unit according to claim 2, wherein
   a flange is formed at an end portion of the gas-discharging-pipe connecting portion,
   another flange is formed at an end portion of the gas-discharging pipe, and
   the flange at the end portion of the gas-discharging-pipe connecting portion and the flange at the end portion of the gas-discharging pipe are hermetically connected via a sealing member.

5. A thermal processing unit according to claim 4, wherein on at least one of the flange at the end portion of the gas-discharging-pipe connecting portion and the flange at the end portion of the gas-discharging pipe, a third temperature controlling unit for controlling a temperature at a connecting portion of the flanges is provided.

6. A thermal processing unit according to claim 5, wherein the third temperature controlling unit has a liquid-flowing tunnel formed in the flange.

7. A thermal processing unit according to claim 5, wherein the third temperature controlling unit has a heating unit for control provided in a vicinity of the flange.

8. A thermal processing unit according to claim 5, wherein the first temperature controlling unit, the second temperature controlling unit and the third temperature controlling unit are adapted to be controlled independently.

9. A thermal processing unit according to claim 2, wherein the gas-discharging-pipe connecting portion is bent.

10. A thermal processing unit according to claim 9, wherein
    the gas-discharging-pipe connecting portion is bent at an angle of about 90 degrees.

11. A thermal processing unit according to claim 1, wherein
    the gas-discharging-pipe connecting portion is formed in such a manner that the gas-discharging-pipe connecting portion is integral with and extended from the reaction container.

12. A thermal processing unit according to claim 1, wherein
    the gas-discharging-pipe connecting portion has a cervical portion whose diameter gradually reduces from a diameter at an upper portion of the reaction container.

13. A thermal processing unit according to claim 12, wherein
    an assistant heating unit is provided in a vicinity of the cervical portion of the gas-discharging-pipe connecting portion.

14. A thermal processing unit according to claim 1, wherein
    the first temperature controlling unit is a heat-insulating member.

15. A thermal processing unit according to claim 1, wherein
    the first temperature controlling unit is a resistance heater.

16. A thermal processing unit according to claim 1, wherein
    the first temperature controlling unit has a flexibility.

17. A thermal processing unit according to claim 1, wherein
    the first temperature controlling unit has been formed into a shape in advance.

18. A thermal processing method of an object to be processed using a thermal processing unit, the thermal processing unit including:
    a heating-furnace body whose upper end has an opening,
    a furnace-body lid provided at an opening of the heating-furnace body,
    a heating unit provided on an inside wall of the heating-furnace body,
    a reaction container consisting of a single tube contained in the heating-furnace body,
    a gas-discharging-pipe connecting portion formed at an upper portion of the reaction container and penetrating the furnace-body lid,
    a first temperature controlling unit provided around the gas-discharging-pipe connecting portion, and
    an object-to-be-processed boat arranged in the reaction container, for holding an object to be processed,
    the thermal processing method comprising:
    a step of conducting a thermal process of the object to be processed by means of the heating unit, and
    a step of controlling a temperature of the gas-discharging-pipe connecting portion to a temperature substantially equal to a thermal processing temperature of the object to be processed, by means of the first temperature controlling unit.

19. A thermal processing method of an object to be processed using a thermal processing unit, the thermal processing unit including:
    a heating-furnace body whose upper end has an opening,
    a furnace-body lid provided at an opening of the heating-furnace body,
    a heating unit provided on an inside wall of the heating-furnace body, a reaction container consisting of a single tube contained in the heating-furnace body, a gas-discharging-pipe connecting portion formed at an upper portion of the reaction container and penetrating the furnace-body lid, an object-to-be-processed boat arranged in the reaction container, for holding an object to be processed, a gas-discharging pipe connected to the gas-discharging-pipe connecting portion, for discharging atmosphere in the reaction container, and a second temperature controlling unit provided around the gas-discharging pipe, the thermal processing method comprising:

a step of conducting a thermal process of the object to be processed by means of the heating unit, and a step of controlling a temperature of the gas-discharging pipe to a temperature of 150 to 300° C., by means of the second temperature controlling unit.

* * * * *